(12) United States Patent
Kawamura

(10) Patent No.: US 11,327,124 B2
(45) Date of Patent: May 10, 2022

(54) GROUND FAULT DETECTION APPARATUS

(71) Applicant: Yazaki Corporation, Tokyo (JP)

(72) Inventor: Yoshihiro Kawamura, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 100 days.

(21) Appl. No.: 16/992,603

(22) Filed: Aug. 13, 2020

(65) Prior Publication Data

US 2021/0072324 A1 Mar. 11, 2021

(30) Foreign Application Priority Data

Sep. 10, 2019 (JP) .............................. JP2019-164210

(51) Int. Cl.
*G01R 31/00* (2006.01)
*G01R 31/52* (2020.01)
*G01R 31/36* (2020.01)

(52) U.S. Cl.
CPC ............. *G01R 31/52* (2020.01); *G01R 31/36* (2013.01)

(58) Field of Classification Search
USPC ................................................. 324/503, 509
See application file for complete search history.

(56) References Cited

U.S. PATENT DOCUMENTS

| 2014/0214262 | A1* | 7/2014 | Iwanabe | G01R 31/52 701/31.7 |
| 2016/0252559 | A1* | 9/2016 | Tamura | G01R 31/64 324/548 |
| 2019/0100104 | A1 | 4/2019 | Kawamura | |
| 2019/0195931 | A1 | 6/2019 | Kawamura | |

FOREIGN PATENT DOCUMENTS

JP 2015-206784 A 11/2015

\* cited by examiner

*Primary Examiner* — Nincent Q Nguyen
(74) *Attorney, Agent, or Firm* — Sughrue Mion, PLLC

(57) ABSTRACT

In a ground fault detection apparatus, a first charge voltage of a detection capacitor measured with a positive electrode side of a high-voltage battery connected in series with a positive electrode side end of the detection capacitor and a negative electrode side end of the detection capacitor grounded, is compared with a second charge voltage of the detection capacitor measured with the positive electrode side end of the detection capacitor grounded and the negative electrode side of the high-voltage battery connected in series with the negative electrode side end of the detection capacitor. When the first charge voltage is smaller and degree of smallness is greater than a predetermined reference, it is determined that positive electrode side insulation resistance is decreased. When the second charge voltage is smaller and degree of smallness is greater than a predetermined reference, it is determined that negative electrode side insulation resistance is decreased.

2 Claims, 11 Drawing Sheets

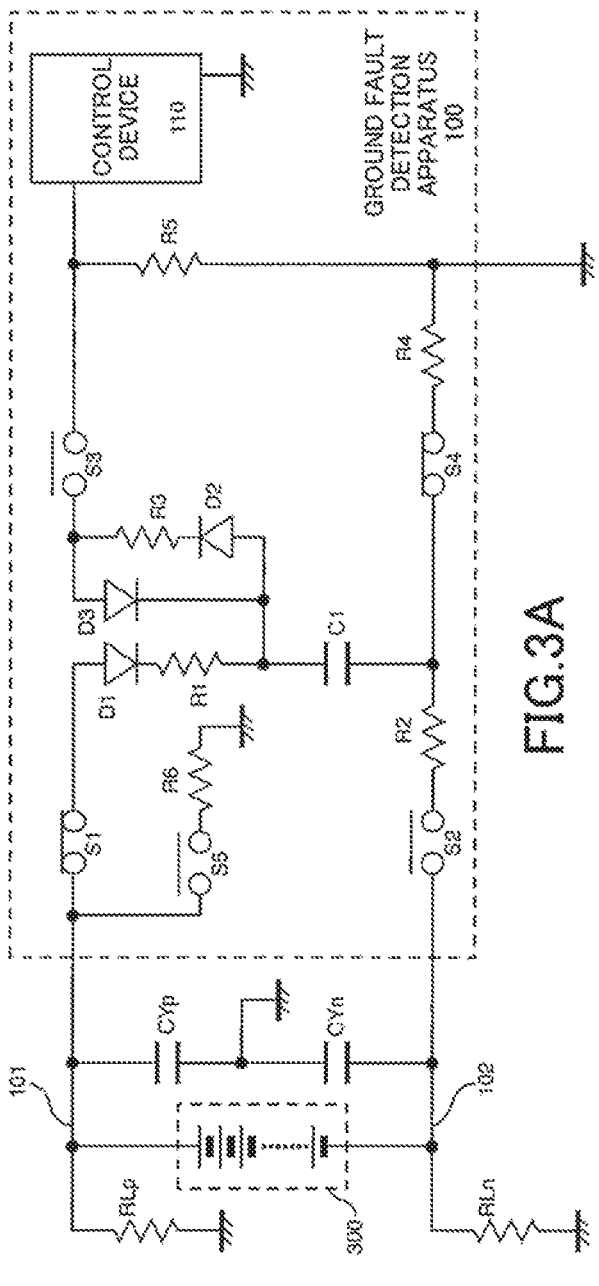
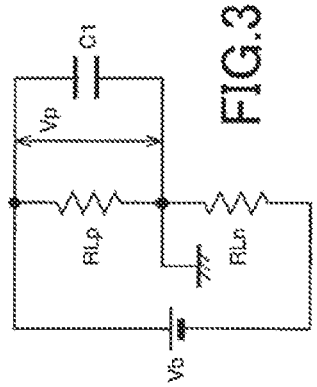
FIG.3A
FIG.3B

GROUND FAULT DETECTION APPARATUS

TECHNICAL FIELD

The present invention relates to a ground fault detection apparatus using a flying capacitor.

BACKGROUND

In a vehicle such as a hybrid car, which includes an engine and an electric motor as driving sources, and an electric vehicle, a battery mounted on a vehicle body is charged, and driving power is generated with the use of electric energy supplied from the battery. In general, a power supply circuit related to the battery is configured as a high-voltage circuit using as high voltage as 200V or higher, and in order to ensure safety, the high-voltage circuit including the battery is in an ungrounded configuration in which the high-voltage circuit is electrically insulated from a vehicle body serving as a reference potential point of a ground.

In a vehicle mounted with a non-grounded high-voltage battery, a ground fault detection apparatus is provided to monitor a state of insulation (ground fault state) between a vehicle body and a system provided with the high-voltage battery, namely, a main power supply system ranging from the high-voltage battery through a motor. As the ground fault detection apparatus, one of a type using a capacitor called a flying capacitor is widely used.

FIG. 11 is a diagram showing an example of a circuit of a conventional ground fault detection apparatus of the flying capacitor type. As shown, a ground fault detection apparatus 400 is connected to an ungrounded high-voltage battery 300 and is configured to detect ground fault of a system provided with the high-voltage battery 300. Herein, insulation resistance between a positive electrode side of the high-voltage battery 300 and a ground is referred to as RLp, and insulation resistance between a negative electrode side and the ground is referred to as RLn.

As shown in FIG. 11, the ground fault detection apparatus 400 includes a detection capacitor C1 that functions as a flying capacitor. In addition, four switches S1-S4 are provided around the detection capacitor C1 to switch the measurement paths and to control charge and discharge of the detection capacitor C1.

To obtain the insulation resistances RLp and RLn, the ground fault detection apparatus 400 repeats measurement operation with one cycle including a V0 measurement period, a Vc1n measurement period, a V0 measurement period, a Vc1p measurement period. In each measurement period, the charge voltage of the detection capacitor C1 is measured after the detection capacitor C1 is charged with a voltage of a measurement target. Then, the detection capacitor C1 is discharged for next measurement.

In the V0 measurement period, a voltage V0 corresponding to a voltage of the high-voltage battery is measured. To do this, the switches S1 and S2 are turned on and the switches S3 and S4 are turned off, thereby the detection capacitor C1 is charged. That is, the high-voltage battery 300, a resistor R1, the detection capacitor C1 and a resistor R2 are in the measurement path.

During the measurement of the charge voltage of the detection capacitor C1, the switches S1 and S2 are turned off and the switches S3 and S4 are turned, and the sampling is performed with a control device 410. Then, the detection capacitor C1 is discharged for next measurement. The operations during the measurement of the charge voltage of the detection capacitor C1 and during the discharge of the detection capacitor C1 are the same in other measurement periods.

In the Vc1n measurement period, a voltage reflecting the effect of the insulation resistance RLn is measured. To do this, the switches S1 and S4 are turned on and the switches S2 and S3 are turned off, thereby the detection capacitor C1 is charged. That is, the high-voltage battery 300, the resistor R1, the detection capacitor C1, a resistor R4, the ground and the insulation resistance RLn are in the measurement path.

In the Vc1p measurement period, a voltage reflecting the effect of the insulation resistance RLp is measured. To do this, the switches S2 and S3 are turned on and the switches S1 and S4 are turned off, thereby the detection capacitor C1 is charged. That is, the high-voltage battery 300, the insulation resistance RLp, the ground, a resistor R5, the detection capacitor C1 and the resistor R2 are in the measurement path.

It is known that $(RLp \times RLn)/(RLp+RLn)$ can be obtained based on $(Vc1p+Vc1n)/V0$ calculated from V0, Vc1n and Vc1p obtained in these measurement periods. Thus, by measuring the V0, Vc1n and Vc1p, the control device 410 in the ground fault detection apparatus 400 can obtain the combined resistance of the insulation resistances RLp, RLn. Then, when the combined resistance of the insulation resistances RLp, RLn becomes equal to or below a predetermined determination reference value, it determines that ground fault is occurring and outputs a warning.

In each measurement period, when the detection capacitor C1 is fully charged, a voltage value of the high-voltage battery 300 is obtained in the V0 measurement period, while in the Vc1n measurement period and the Vc1p measurement period a voltage value which is the voltage of the high-voltage battery 300 divided by the insulation resistance RLn, RLp will be obtained, so the insulation resistance cannot be calculated using the above-mentioned equation. Thus, the charge time for each measurement period is set to time that takes the detection capacitor C1 to be charged about 50%.

PRIOR ART DOCUMENT

Patent Document

Patent Document 1: JP 2015-206784 A

SUMMARY OF THE INVENTION

In general, capacitors CYp and CYn which are so-called Y-capacitors (line bypass capacitor) are connected between a positive electrode side power line 301 of the high-voltage battery 300 and the ground electrode and between a negative electrode side power line 302 and the ground electrode, respectively, in order to suppress high frequency noise produced by the power supply and stabilize the operation. Especially when the high-voltage battery 300 is connected to a high-voltage facility including a charge facility, the Y-capacitors with large capacitance are connected.

In the case where the Y-capacitors with large capacitance are connected, when performing each measurement in the ground fault detection apparatus 400, there may be an adverse effect on the measurement value due to, for example, the movement of the electric charges stored in the Y-capacitor to the detection capacitor C1. If the capacitance of the detection capacitor C1 is increased to reduce this effect, then the charge speed will decrease and the measurement time will get longer.

In view of the above-described problem, an object of the present invention is to provide a ground fault detection apparatus adapted for a Y capacitor with large capacitance.

In order to achieve the above-described object, the present invention provides, in one aspect, a ground fault detection apparatus configured to be connected to a high-voltage battery and configured to detect decrease in insulation resistance of a system provided with the high-voltage battery, including: a detection capacitor that operates as a flying capacitor; a control device configured to measure a full charge voltage of the detection capacitor; a first switching part configured to switch between a state (a positive electrode first state) where a positive electrode side of the high-voltage battery and a positive electrode side end of the detection capacitor are connected in series via a resistor and a state (a positive electrode second state) where the positive electrode side end of the detection capacitor is grounded via a resistor; and a second switching part configured to switch between a state (a negative electrode first state) where a negative electrode side of the high-voltage battery and a negative electrode side end of the detection capacitor are connected in series via a resistor and a state (a negative electrode second state) where the negative electrode side end of the detection capacitor is grounded via a resistor. The control device is configured to compare a charge voltage Vp of the detection capacitor and a charge voltage Vn of the detection capacitor, the charge voltage Vp being measured with the first switching part switched to the positive electrode first state and the second switching part switched to the negative electrode second state, and the charge voltage Vn being measured with the first switching part switched to the positive electrode second state and the second switching part switched to the negative electrode first state, and determine that positive electrode side insulation resistance is decreased when the charge voltage Vp is smaller than the charge voltage Vn and degree of smallness is greater than a predetermined reference, and determine that negative electrode side insulation resistance is decreased when the charge voltage Vn is smaller than the charge voltage Vp and degree of smallness is greater than a predetermined reference.

The ground fault detection apparatus further includes a switch and a resistor connected in series between the positive electrode side of the high-voltage battery and a ground. The control device is configured to: turn off the switch when measuring the charge voltage Vp and the charge voltage Vn; when degree of smallness of one of the charge voltage Vp and the charge voltage Vn which is smaller is not greater than the predetermined reference, measure a charge voltage Vp' of the detection capacitor with the first switching part switched to the positive electrode first state, the second switching part switched to the negative electrode second state and the switch turned on; and determine the positive electrode side insulation resistance and the negative electrode side insulation resistance are decreased when a change ratio of the charge voltage Vp to the charge voltage Vp' is smaller than a reference. Further, the ground fault detection apparatus may further include a switch and a resistor connected in series between the negative electrode side of the high-voltage battery and a ground. The control device is configured to: turn off the switch during measurement of the charge voltage Vp and the charge voltage Vn; when degree of smallness of one of the charge voltage Vp and the charge voltage Vn which is smaller is not greater than the predetermined reference, measure a charge voltage Vn' of the detection capacitor with the first switching part switched to the positive electrode second state, the second switching part switched to the negative electrode first state and the switch turned on; and determine the positive electrode side insulation resistance and the negative electrode side insulation resistance are decreased when a change ratio of the charge voltage Vn to the charge voltage Vn' is smaller than a reference.

The present invention described above can provide a ground fault detection apparatus adapted for a Y capacitor with large capacitance.

BRIEF DESCRIPTION OF THE DRAWINGS

FIG. 3A and FIG. 3B illustrate a Vp measurement;

DETAILED DESCRIPTION OF THE EXEMPLARY EMBODIMENTS

<Ground Fault Detection Apparatus 100>

Figure 1:
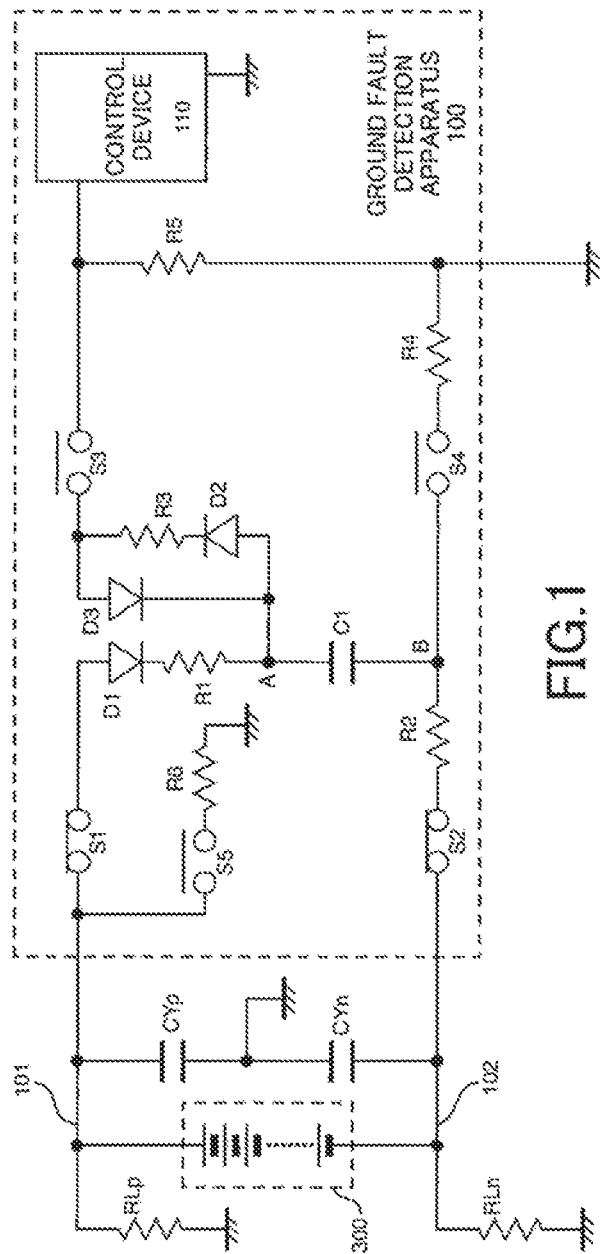
FIG. 1 is a block diagram showing a configuration of a ground fault detection apparatus according to an embodiment of the present invention.

In the following, a ground fault detection apparatus according to an embodiment of the present invention will be explained with reference to the drawings. FIG. 1 is a block diagram showing a configuration of a ground fault detection apparatus 100 according to an embodiment of the present invention. As shown, the ground fault detection apparatus 100 is an apparatus of a flying capacitor type configured to be connected to a high-voltage battery 300 to detect ground fault of a system provided with the high-voltage battery 300. Herein, insulation resistance between a positive electrode side of the high-voltage battery 300 and a ground is referred to as RLp, and insulation resistance between a negative electrode side of the high-voltage battery 300 and the ground is referred to as RLn.

The high-voltage battery 300 is a battery used to supply power for a vehicle to travel. The high-voltage battery 300 is constituted of a chargeable battery such as a lithium ion battery, and is discharged via a bus bar not shown to drive an electric motor connected thereto via an inverter and such. Also, it is charged via the bus bar during regeneration or when it is connected to a charge facility.

In general, capacitors CYp and CYn which are so-called Y-capacitors (line bypass capacitor) are connected between a positive electrode side power line 101 of the high-voltage battery 300 and the ground electrode and between a negative electrode side power line 102 and the ground electrode, respectively, in order to suppress high frequency noise produced by the power supply and stabilize the operation.

As shown in FIG. 1, the ground fault detection apparatus 100 includes a detection capacitor C1 that functions as a flying capacitor and a control device 110. The detection capacitor C1 has a positive electrode side end connected to a contact point A and a negative electrode side end connected to a contact point B.

The ground fault detection apparatus 100 includes four switches S1-S4 arranged around the detection capacitor C1 to switch measurement paths and to control charge and discharge of the detection capacitor C1. These switches may be constituted of switching elements of an insulated type such as photo MOS-FETs.

The switch S1 has one end connected to the positive electrode side power line 101 and another end connected to an anode of a diode D1. A cathode of the diode D1 is connected to one end of a resistor R1 and another end of the resistor R1 is connected to the contact point A.

The switch S2 includes one end connected to the negative electrode side power line 102 and another end connected to one end of the resistor R2. Another end of the resistor R2 is connected to the contact point B.

The switch S3 includes one end connected to one end of a resistor R3 and to an anode of a diode D3, and another end connected to one end of a resistor R5 and to an analog input terminal of the control device 110. A cathode of the diode D3 is connected to the contact point A, another end of the resistor R3 is connected to a cathode of the diode D2, and an anode of the diode D2 is connected to the contact point A. Another end of the resistor R5 is grounded.

The switch S4 has one end connected to the contact point B and another end connected to a resistor R4. Another end of the resistor R4 is grounded.

The control device 110 is constituted of a microcomputer and such and is configured to perform various controls required in the ground fault detection apparatus 100 by executing a pre-embedded program. Specifically, the control device 110 individually controls the switches S1-S4 to switch the measurement paths and controls charge and discharge of the detection capacitor C1.

Further, with input of an analog voltage level corresponding to a charge voltage of the detection capacitor C1 from the analog input terminal, the control device 110 detects reduction in the insulation resistance of the system provided with the high-voltage battery 300 based on the analog voltage level.

Further, in this embodiment, one end of a resistor R6 is connected to the positive electrode side power line 101 via a switch S5, where another end of the resistor R6 is grounded. Considering safety, a resistance value of the resistor R6 may have the similar value as the insulation resistance value.

In this embodiment, measurements are performed with the detection capacitor C1 in a fully charged state. Even in the case where the Y capacitors (CYp, CYn) with large capacitance are connected, the detection capacitor C1 is not required to have large capacitance, thus time for full charge for measurement can be short. In addition, since divided voltage values of the high-voltage battery 300 provided by resistors are measured as explained below, there is no need to wait for the Y capacitors to be stabilized.

<Operation of the Ground Fault Detection Apparatus 100>

Figure 2:
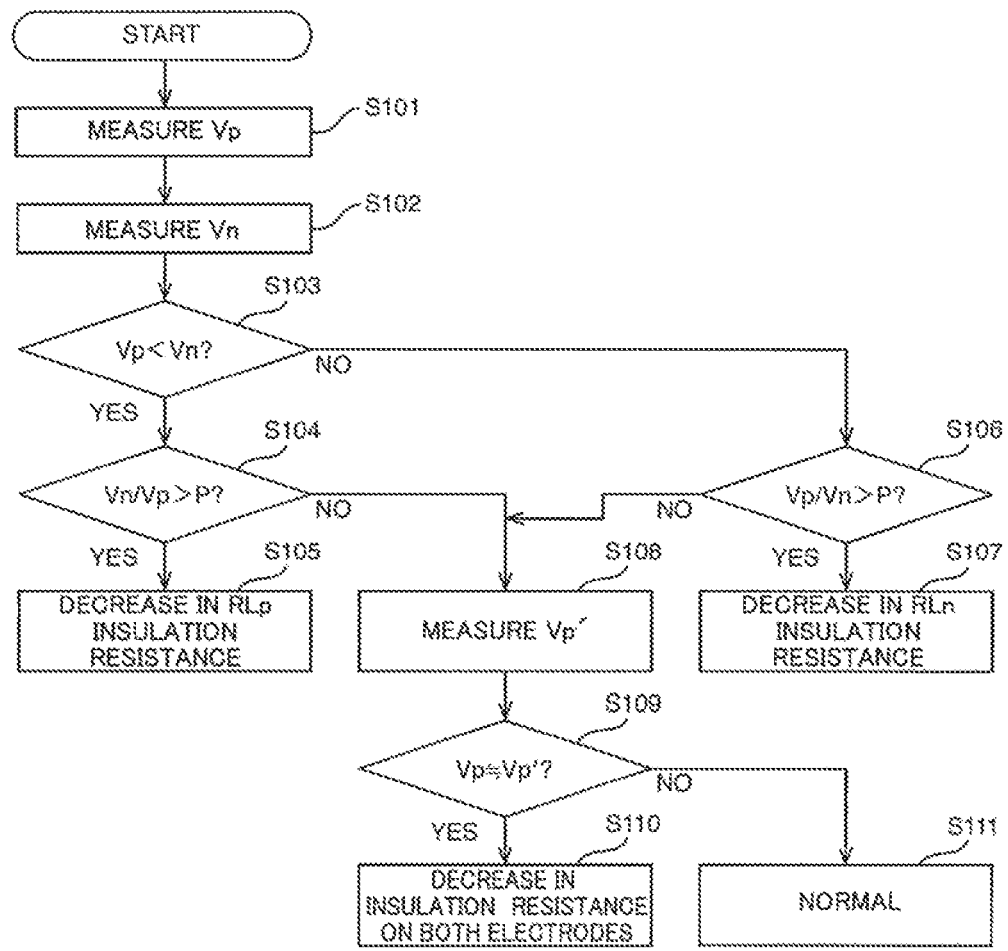
FIG. 2 is a flowchart illustrating an operation of the ground fault detection apparatus.

Next, an operation of the ground fault detection apparatus 100 having the above-described configuration will be explained with reference to the flowchart of FIG. 2. As described above, in this embodiment, measurement is performed with the detection capacitor C1 in a fully charged state. Thus, determination of ground fault is performed using a method different from the conventional method that calculates the insulation resistance.

Firstly, as shown in FIG. 3A, the detection capacitor C1 is fully charged in a state where the switches S1 and S4 are turned on and the switches S2 and S3 are turned off, and a charge voltage Vp in this state is measured (step S101).

As shown in FIG. 3B, the charge voltage Vp corresponds to a voltage across the resistance RLp produced when a voltage Vb of the high-voltage battery 300 is divided by the resistance RLp and the resistance RLn.

Figure 4A:
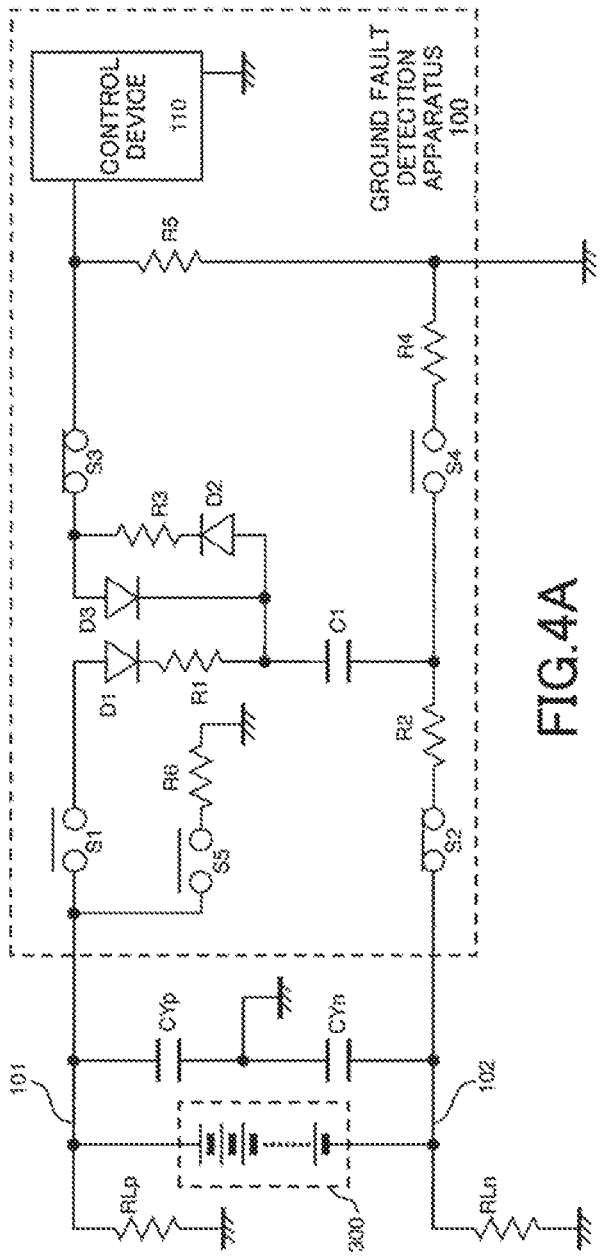
FIG. 4A and FIG. 4B illustrate a Vn measurement.

Next, as shown in FIG. 4A, the detection capacitor C1 is fully charged in a state where the switches S1 and S4 are turned off and the switches S2 and S3 are turned on, and a charge voltage Vn in this state is measured (step S102).

Figure 4B:
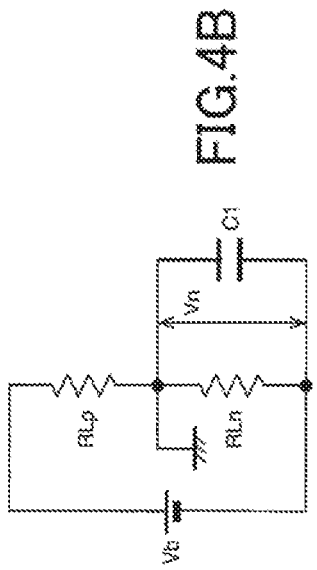

As shown in FIG. 4B, the charge voltage Vn corresponds to a voltage across the resistance RLn produced when the voltage Vb of the high-voltage battery 300 is divided by the resistance RLp and the resistance RLn. It is noted that order of the measurement of the charge voltage Vn and the measurement of the charge voltage Vp may be selected arbitrary.

When the charge voltage Vp is smaller than the charge voltage Vn (Yes in step S103), if the degree of smalless is greater than a predetermined reference, e.g., if Vn/Vp>reference value P (Yes in step S104), then it is determined that there is decrease in the positive electrode side insulation resistance RLp (step S105).

This is because, when the charge voltage Vp is smaller than the charge voltage Vn, it means that the positive electrode side insulation resistance RLp is smaller than the negative electrode side insulation resistance RLn, and it can be said that the greater the degree of that smallness becomes, the more the positive electrode side insulation resistance RLp has decreased.

Similarly, when the charge voltage Vp is equal to or greater than the charge voltage Vn (No in step S103), if the degree of smalless of the charge voltage Vn with respect to the charge voltage Vp is greater than a predetermined reference, e.g., if Vp/Vn>reference value P (Yes in step S106), then it is determined that there is decrease in the negative electrode side insulation resistance RLn (step S107).

Figure 5A:
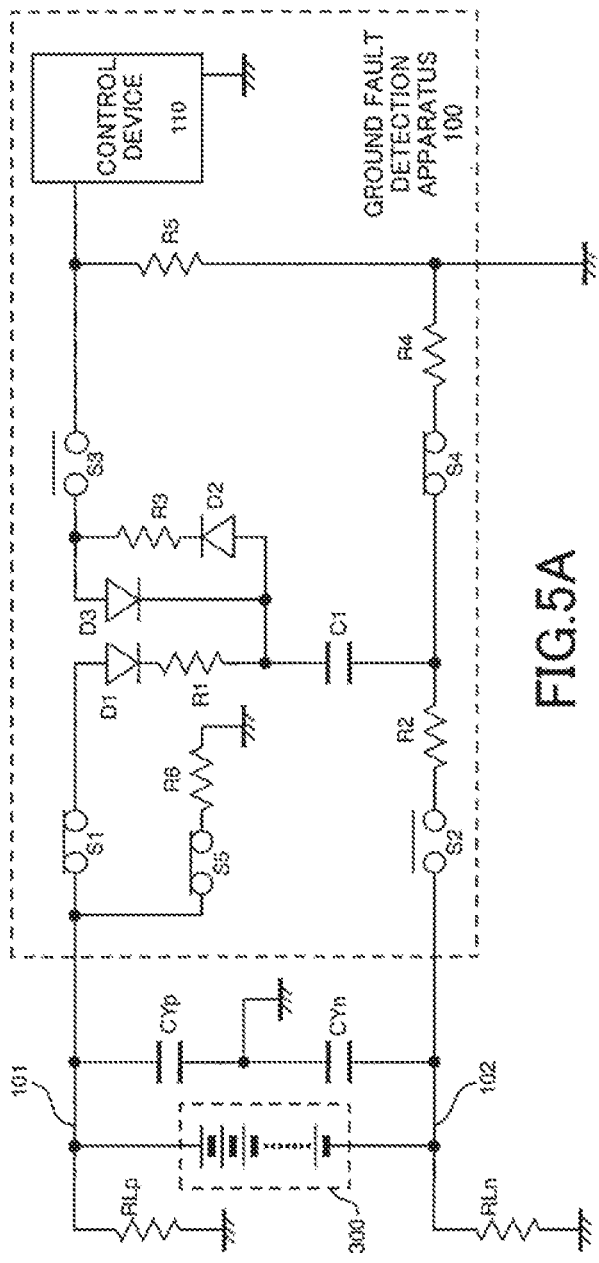
FIG. 5A and FIG. 5B illustrate a Vp' measurement.

In the case where the difference between the charge voltage Vp and the charge voltage Vn is relatively small, then it is likely that both of the positive electrode side insulation resistance RLp and the negative electrode side insulation resistance RLn are normal; however, it is possible, although the possibility is small, that both of the positive electrode side insulation resistance RLp and the negative electrode side insulation resistance RLn have decreased to the same degree. In view of this, when the charge voltage Vp is smaller than the charge voltage Vn (Yes in S103) and if the difference between the charge voltage Vp and the charge voltage Vn is relatively small, i.e., when Vn/Vp≤reference value P (No in S104), then the detection capacitor C1 is fully charged in a state where the switches S1 and S4 and additionally the switch S5 are turned on and the switches S2 and S3 are turned off, as shown in FIG. 5A, and a charge voltage Vp' in this state is measured (step S108). Also, when the charge voltage Vp is equal to or greater than the charge voltage Vn (No in S103) and if the difference between the charge voltage Vp and the charge voltage Vn is relatively small, i.e., when Vp/Vn≤reference value P (No in S107), then, in this case also, the charge voltage Vp' is measured (S108).

Figure 5B:
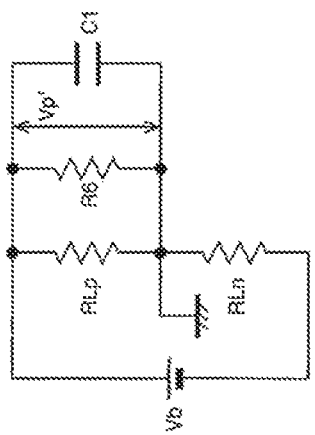

As shown in FIG. 5B, the charge voltage Vp' corresponds to a voltage across a combined parallelly-arranged resistance of the resistance RLp and the resistor R6 produced when the voltage Vb of the high-voltage battery 300 is divided by the resistance RLn and the combined parallelly-arranged resistance of the resistance RLp and the resistor R6.

When it is considered that the charge voltage Vp and the charge voltage Vp' are substantially the same, e.g., when a change ratio of the charge voltage Vp to the charge voltage Vp', (Vp/Vp'), is smaller than a reference value (Yes in step S109), this is when the effect of the interposed resistor R6 is small, thus it is determined that there is decrease in both of the positive electrode side insulation resistance RLp and the negative electrode side insulation resistance RLn (step S110).

On the other hand, when it cannot be considered that the charge voltage Vp and the charge voltage Vp' are substantially the same, e.g., when the change ratio of the charge voltage Vp to the charge voltage Vp' is greater than the reference value (No in step S109), this is when the effect of the interposed resistor R6 is great, thus it is determined that both of the positive electrode side insulation resistance RLp and the negative electrode side insulation resistance RLn are not decreased and are normal (step S111).

<Another Embodiment of the Ground Fault Detection Apparatus 100>

Figure 6A:
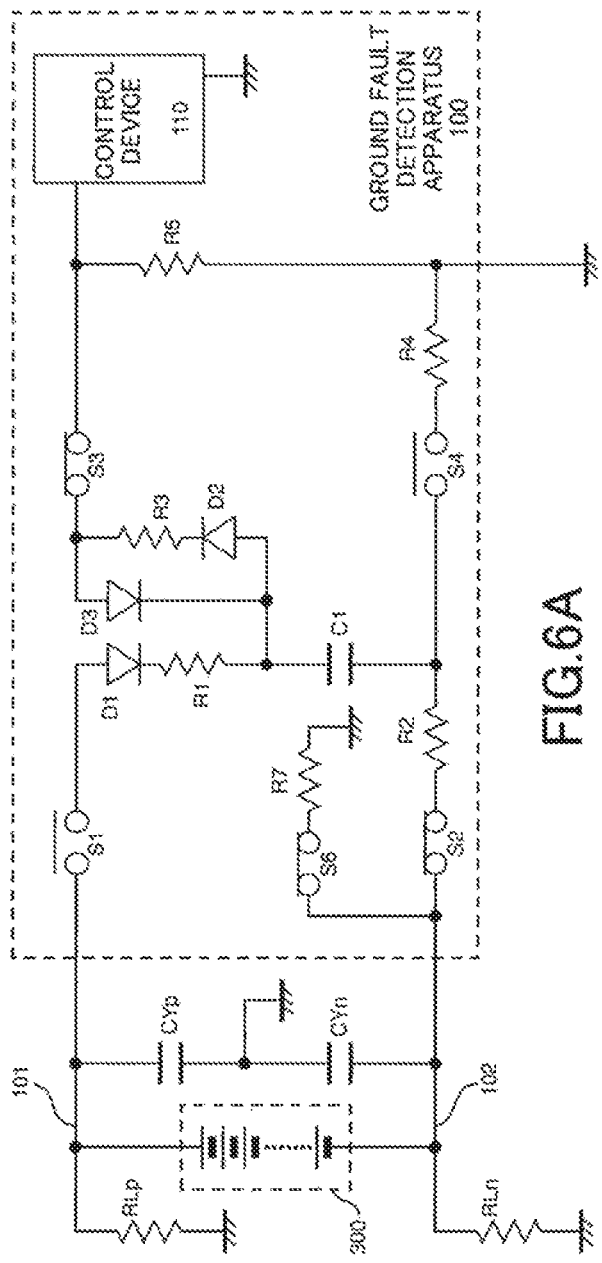
FIG. 6A and FIG. 6B illustrate a Vn' measurement.
Figure 6B:
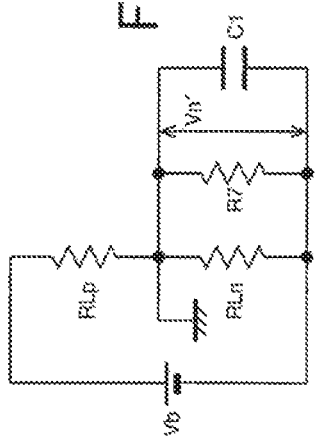

Further, as shown in FIG. 6A and FIG. 6B, instead of using the switch S5 and the resistor R6, a switch S6 may be provided in the negative electrode side power line 101 so that one end of a resistor R7 is connected to the switch S6 and another end of the resistor R7 is ungrounded, and it may be configured such that, if the difference between the charge voltage Vp and the charge voltage Vn is relatively small, then the detection capacitor C1 is fully charged in a state where the switches S2 and S3 and additionally the switch S6 are turned on and the switches S1 and S4 are turned off and the charge voltage Vn' at this time is measured, and a change ratio of the charge voltage Vn to the charge voltage Vn', (Vn/Vn'), may be used to determine whether there is decrease in the insulation resistance for both electrodes or whether the insulation resistance is normal. That is, if the change ratio of the charge voltage Vn to the charge voltage Vn' is smaller than a reference value, then it is determined that there is decrease in both of the positive electrode side insulation resistance RLp and the negative electrode side insulation resistance RLn, and if the change ratio of the charge voltage Vn to the charge voltage Vn' is greater than the reference value, then it is determined that both of the positive electrode side insulation resistance RLp and the negative electrode side insulation resistance RLn are not decreased and are normal. Considering safety, a resistance value of the resistor R7 may have the similar value as the insulation resistance value.

Figure 7A:
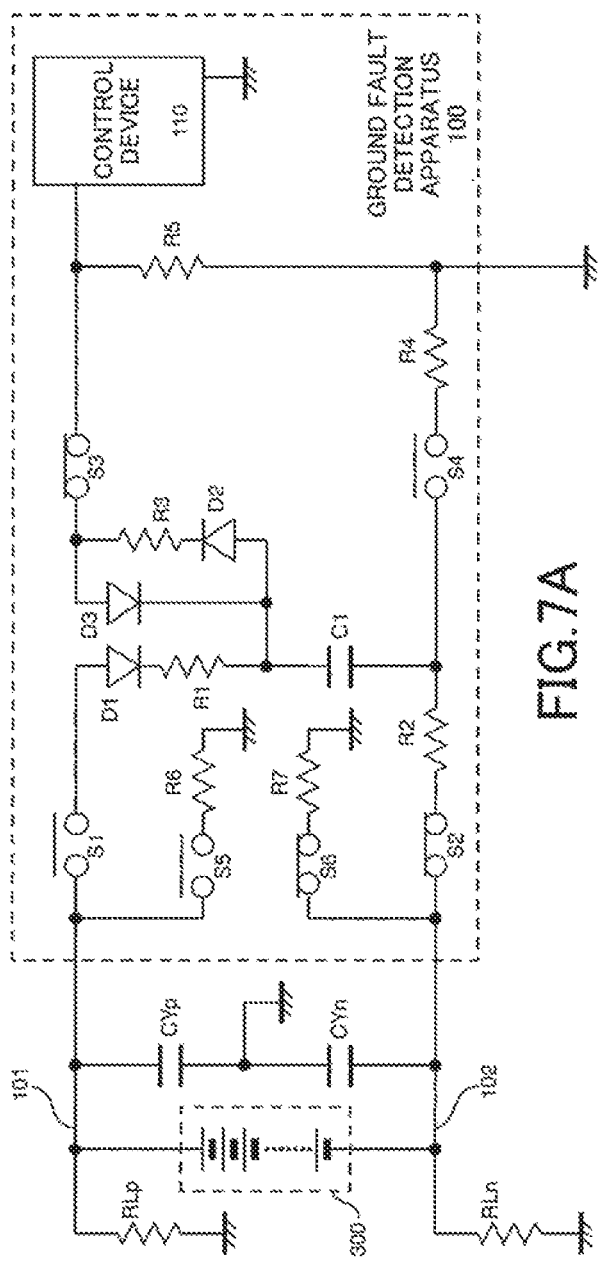
FIG. 7A and FIG. 7B illustrate a Vn' measurement.
Figure 8A:
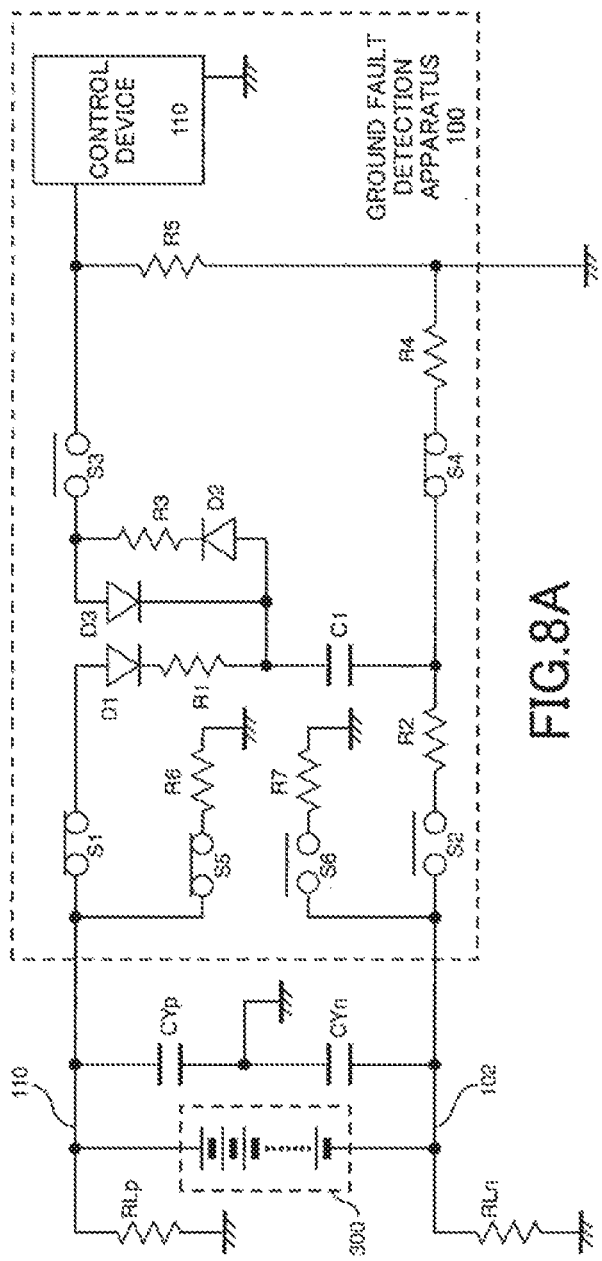
FIG. 8A and FIG. 8B illustrate a Vp' measurement.

In the embodiment described above, in the case where the difference between the charge voltage Vp and the charge voltage Vn is relatively small, only the charge voltage Vp' is measured, or only the charge voltage Vn' is measured, regardless of the magnitude of the charge voltage Vp or the charge voltage Vn to determine whether there is decrease in the insulation resistance for both electrodes or whether the insulation resistance is normal. However, as shown in FIG. 7A and FIG. 8A, the switches S5 and S6 and the resistors R6 and R7 may be provided, and the resistor (R6 or R7) may be connected in parallel to either one of the positive electrode side insulation resistance RLp and the negative electrode side insulation resistance RLn having the greater value and the change ratio of the charge voltages at this time may be determined. That is, in the case where the difference between the charge voltage Vp and the charge voltage Vn is relatively small, if the charge voltage Vp is smaller which means that the negative electrode side insulation resistance RLn is greater, then the resistor R7 may be connected in parallel to the negative electrode side insulation resistance RLn and the charge voltage Vn' at this time may be measured, while if the charge voltage Vn is smaller which means that the positive electrode side insulation resistance RLp is greater, then the resistor R6 may be connected in parallel to the positive electrode side insulation resistance RLp and the charge voltage Vp' at this time may be measured.

For example, in the case where the charge voltage Vp is greater than the charge voltage Vn and when the difference between the charge voltage Vp and the charge voltage Vn is relatively small, e.g., when Vp/Vn<reference value P, the detection capacitor C1 is fully charged in a state where the switches S2 and S3 and additionally the switch S6 are turned on and the switches S1 and S4 are turned off, as shown in FIG. 7A, and the charge voltage Vn' at this time is measured.

Figure 7B:
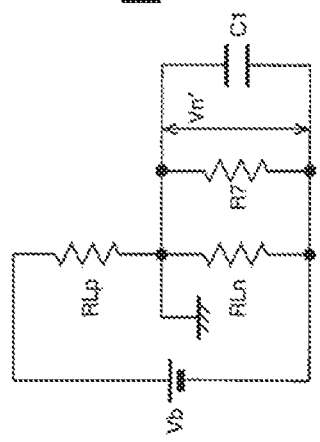

As shown in FIG. 7B, the charge voltage Vn' corresponds to a voltage across a combined parallelly-arranged resistance of the resistance RLn and the resistor R7 produced when the voltage Vb of the high-voltage battery 300 is divided by the resistance RLp and the combined parallelly-arranged resistance of the resistance RLn and the resistor R7.

When it is considered that the charge voltage Vn and the charge voltage Vn' are substantially the same, e.g., when a change ratio of the charge voltage Vn to the charge voltage Vn', (Vn/Vn'), is smaller than a reference value, this is when the effect of the interposed resistor R7 is small, thus it is determined that there is decrease in both of the positive electrode side insulation resistance RLp and the negative electrode side insulation resistance RLn.

On the other hand, when it cannot be considered that the charge voltage Vn and the charge voltage Vn' are substantially the same, e.g., when the change ratio of the charge voltage Vn to the charge voltage Vn' is greater than the reference value, this is when the effect of the interposed resistor R7 is great, thus it is determined that both of the positive electrode side insulation resistance RLp and the negative electrode side insulation resistance RLn are not decreased and are normal.

In the case where the charge voltage Vn is greater than the charge voltage Vp and when the difference between the charge voltage Vp and the charge voltage Vn is relatively small, e.g., when Vn/Vp<reference value P, the detection capacitor C1 is fully charged in a state where the switches S1 and S4 and additionally the switch S5 are turned on and the switches S2 and S3 are turned off, as shown in FIG. 8A, and the charge voltage Vp' at this time is measured.

Figure 8B:
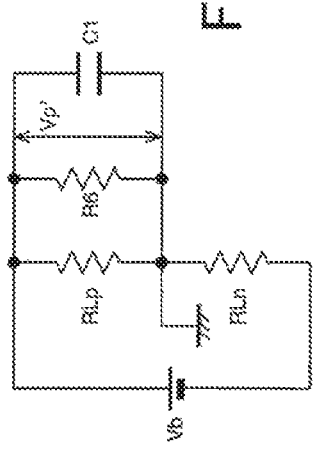

As shown in FIG. 8B, the charge voltage Vp' corresponds to a voltage across a combined parallelly-arranged resistance of the resistance RLp and the resistor R6 produced when the voltage Vb of the high-voltage battery 300 is divided by the resistance RLn and the combined parallelly-arranged resistance of the resistance RLp and the resistor R6.

When it is considered that the charge voltage Vp and the charge voltage Vp' are substantially the same, e.g., when a change ratio of the charge voltage Vp to the charge voltage Vp', (Vp/Vp'), is smaller than a reference value, this is when the effect of the interposed resistor R6 is small, thus it is determined that there is decrease in both of the positive electrode side insulation resistance RLp and the negative electrode side insulation resistance RLn.

On the other hand, when it cannot be considered that the charge voltage Vp and the charge voltage Vp' are substantially the same, e.g., when the change ratio of the charge voltage Vp to the charge voltage Vp' is greater than the reference value, this is when the effect of the interposed resistor R6 is great, thus it is determined that both of the positive electrode side insulation resistance RLp and the negative electrode side insulation resistance RLn are not decreased and are normal.

<Switching Part>

In this embodiment, there is always one of the switches S1 and S3 turned on. Also, these switches are not turned on at the same time. Thus, the switches S1 and S3 constitute a switching part that switches between a state where the positive electrode side of the high-voltage battery 300 and the positive electrode side end of the detection capacitor C1 are connected in series, and a state where the positive electrode side end of the detection capacitor C1 is connected to the ground. This switching part may be constituted of a Form C contact switch Sc1 instead of the switches S1 and S3 as shown in FIG. 9, or may be constituted of a twin relay St1 including two Form C contact switches which operate in an interlocked manner as shown in FIG. 10.

Similarly, in this embodiment, there is always one of the switches S2 and S4 turned on. Also, these switches are not turned on at the same time. Thus, the switches S2 and S4 constitute a switching part that switches between a state where the negative electrode side of the high-voltage battery 300 and the negative electrode side end of the detection capacitor C1 are connected in series, and a state where the negative electrode side end of the detection capacitor C1 is connected to the ground. This switching part may be constituted of a Form C contact switch Sc2 instead of the switches S2 and S4 as shown in FIG. 9, or may be constituted of a twin relay St2 as shown in FIG. 10.

Figure 9:
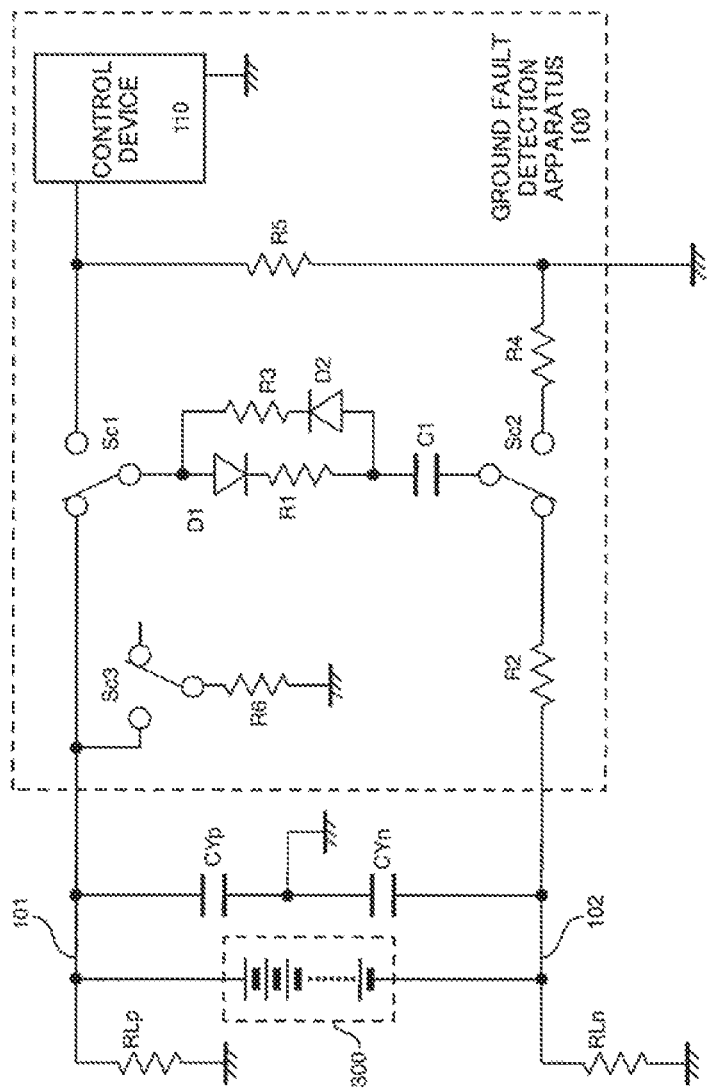
FIG. 9 is a block diagram showing a configuration of a ground fault detection apparatus according to an embodiment of the present invention.
Figure 10:
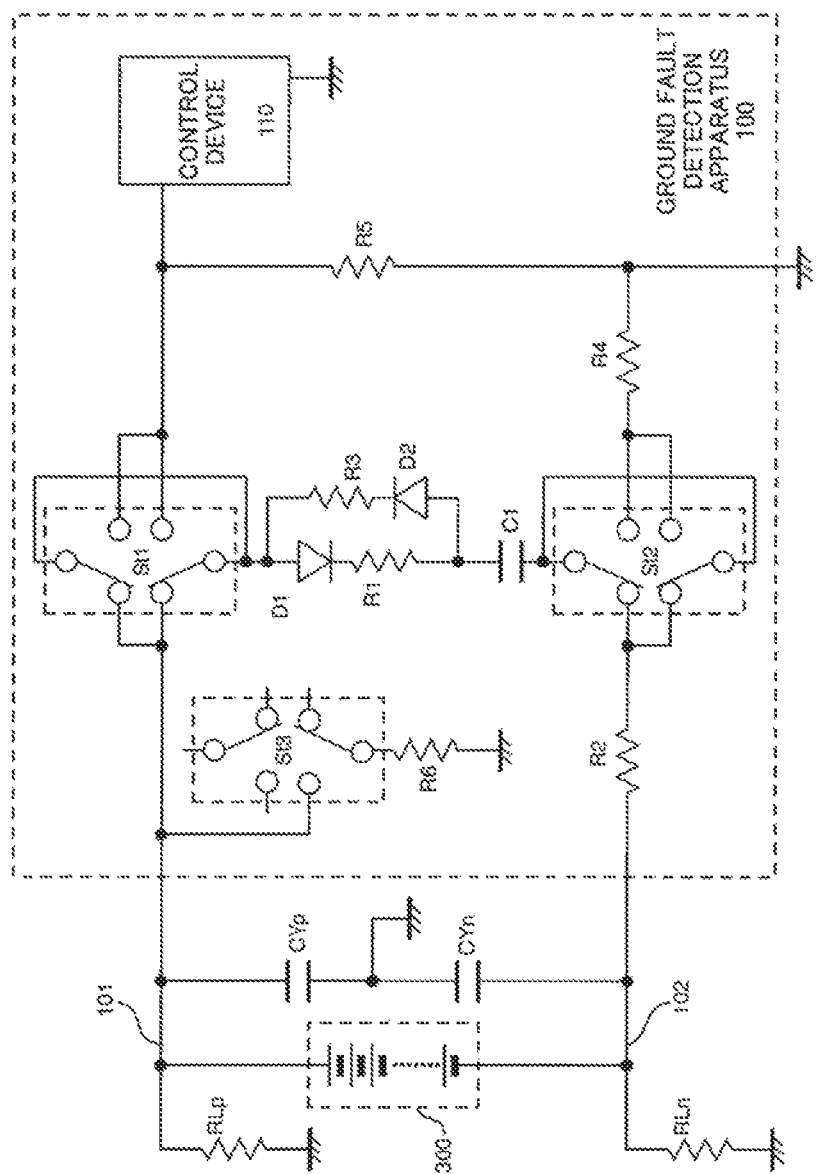
FIG. 10 is a block diagram showing a configuration of a ground fault detection apparatus according to an embodiment of the present invention.
Figure 11:
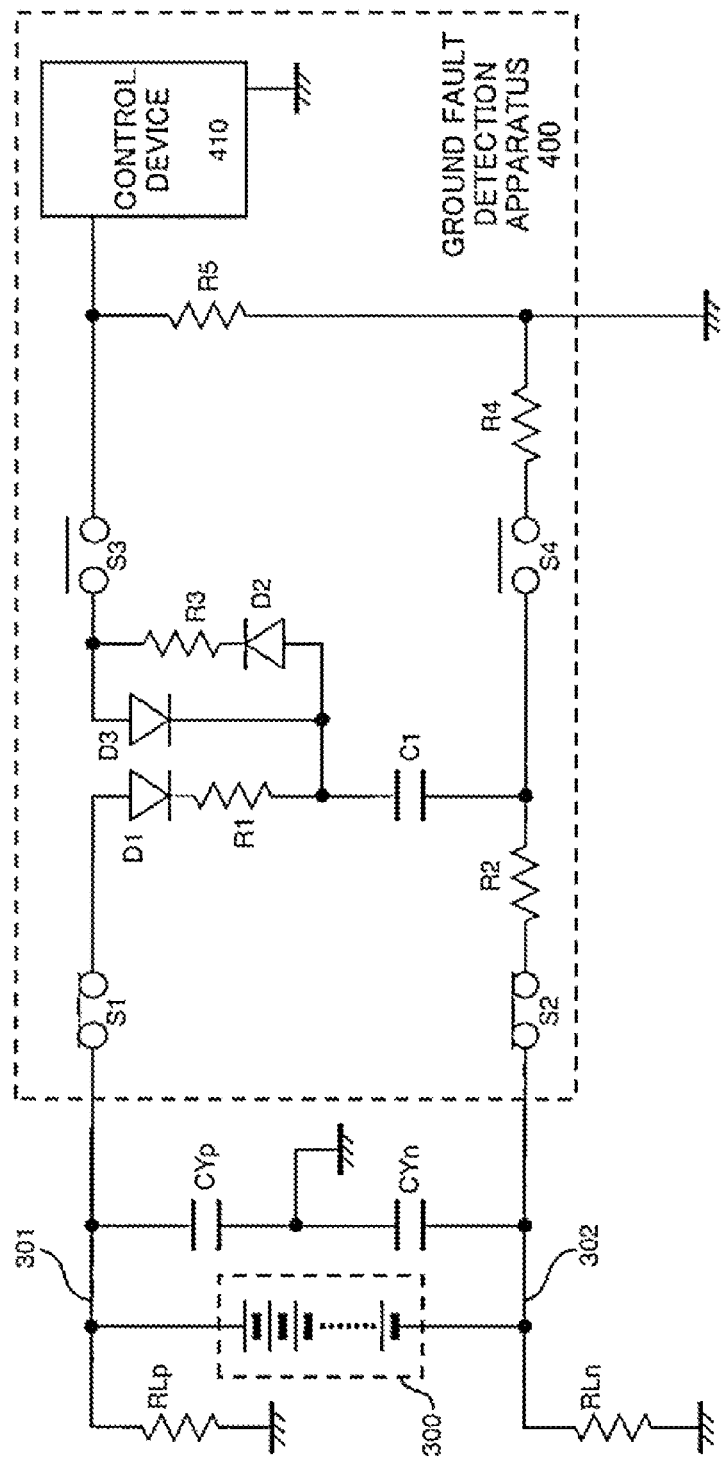
FIG. 11 is a block diagram showing a circuit example of a conventional ground fault detection apparatus of a flying capacitor type.

In addition, the switches S5 and S6 may be constituted of a Form C contact switch as a Form C contact switch Sc3 shown in FIG. 9, or may be constituted of a twin relay as a twin relay St3 shown in FIG. 10.

LIST OF REFERENCE SIGNS 100 ground fault detection apparatus
101 positive electrode side power line
102 negative electrode side power line
110 control device
300 high-voltage battery
C1 detection capacitor
CYp Y capacitor
CYn Y capacitor
RLn negative electrode side insulation resistance
RLp positive electrode side insulation resistance

What is claimed is:

1. A ground fault detection apparatus configured to be connected to a high-voltage battery and configured to detect decrease in insulation resistance of a system provided with the high-voltage battery, comprising:
   a detection capacitor that operates as a flying capacitor;
   a control device configured to measure a full charge voltage of the detection capacitor;
   a first switching part configured to switch between
      a positive electrode first state where a positive electrode side of the high-voltage battery and a positive electrode side end of the detection capacitor are connected in series via a resistor, and
      a positive electrode second state where the positive electrode side end of the detection capacitor is grounded via a resistor;
   a second switching part configured to switch between
      a negative electrode first state where a negative electrode side of the high-voltage battery and a negative electrode side end of the detection capacitor are connected in series via a resistor and
      a negative electrode second state where the negative electrode side end of the detection capacitor is grounded via a resistor, and
   a switch and a resistor connected in series between the positive electrode side of the high-voltage battery and a ground,
   wherein the control device is configured to:
      compare a first charge voltage Vp of the detection capacitor and a second charge voltage Vn of the detection capacitor, the first charge voltage Vp being measured with the first switching part switched to the positive electrode first state and the second switching part switched to the negative electrode second state, and the second charge voltage Vn being measured with the first switching part switched to the positive electrode second state and the second switching part switched to the negative electrode first state,
      determine that positive electrode side insulation resistance is decreased when the first charge voltage Vp is smaller than the second charge voltage Vn and degree of smallness is greater than a predetermined reference, and determine that negative electrode side insulation resistance is decreased when the second charge voltage Vn is smaller than the first charge voltage Vp and degree of smallness is greater than a predetermined reference,
      turn off the switch during measurement of the first charge voltage Vp and the second charge voltage Vn,
      when degree of smallness of one of the first charge voltage Vp and the second charge voltage Vn which is smaller is not greater than the predetermined reference, measure a third charge voltage Vp' of the detection capacitor with the first switching part switched to the positive electrode first state, the second switching part switched to the negative electrode second state and the switch turned on, and
      determine the positive electrode side insulation resistance and the negative electrode side insulation resistance are decreased when a change ratio of the first charge voltage Vp to the third charge voltage Vp' is smaller than a reference.

2. A ground fault detection apparatus configured to be connected to a high-voltage battery and configured to detect decrease in insulation resistance of a system provided with the high-voltage battery, comprising:
   a detection capacitor that operates as a flying capacitor;
   a control device configured to measure a full charge voltage of the detection capacitor;
   a first switching part configured to switch between
      a positive electrode first state where a positive electrode side of the high-voltage battery and a positive electrode side end of the detection capacitor are connected in series via a resistor, and
      a positive electrode second state where the positive electrode side end of the detection capacitor is grounded via a resistor;
   a second switching part configured to switch between
      a negative electrode first state where a negative electrode side of the high-voltage battery and a negative electrode side end of the detection capacitor are connected in series via a resistor and
      a negative electrode second state where the negative electrode side end of the detection capacitor is grounded via a resistor; and
   a switch and a resistor connected in series between the negative electrode side of the high-voltage battery and a ground, wherein the control device is configured to:
compare a first charge voltage Vp of the detection capacitor and a second charge voltage Vn of the detection capacitor, the first charge voltage Vp being measured with the first switching part switched to the positive electrode first state and the second switching part switched to the negative electrode second state, and the second charge voltage Vn being measured with the first switching part switched to the positive electrode second state and the second switching part switched to the negative electrode first state, determine that positive electrode side insulation resistance is decreased when the first charge voltage Vp is smaller than the second charge voltage Vn and degree of smallness is greater than a predetermined reference, and determine that negative electrode side insulation resistance is decreased when the second charge voltage Vn is smaller than the first charge voltage Vp and degree of smallness is greater than a predetermined reference, turn off the switch during measurement of the first charge voltage Vp and the second charge voltage Vn, when degree of smallness of one of the first charge voltage Vp and the second charge voltage Vn which is smaller is not greater than the predetermined reference, measure a fourth charge voltage Vn' of the detection capacitor with the first switching part switched to the positive electrode second state, the second switching part switched to the negative electrode first state, and the switch turned on, and determine the positive electrode side insulation resistance and the negative electrode side insulation resistance are decreased when a change ratio of the second charge voltage Vn to the fourth charge voltage Vn' is smaller than a reference.

* * * * *